(12) United States Patent
Ali et al.

(10) Patent No.: US 8,866,541 B2
(45) Date of Patent: Oct. 21, 2014

(54) DISTORTION CANCELLATION IN ANALOG CIRCUITS

(71) Applicants: Ahmed M. A. Ali, Oak Ridge, NC (US); Paritosh Bhoraskar, Greensboro, NC (US)

(72) Inventors: Ahmed M. A. Ali, Oak Ridge, NC (US); Paritosh Bhoraskar, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/755,908

(22) Filed: Jan. 31, 2013

(65) Prior Publication Data
US 2013/0278230 A1 Oct. 24, 2013

Related U.S. Application Data

(60) Provisional application No. 61/636,053, filed on Apr. 20, 2012.

(51) Int. Cl.
| | |
|---|---|
| H03K 5/00 | (2006.01) |
| G06F 17/50 | (2006.01) |
| H03F 1/32 | (2006.01) |
| G05F 3/02 | (2006.01) |
| G11C 27/02 | (2006.01) |

(52) U.S. Cl.
CPC .............. *G05F 3/02* (2013.01); *G06F 17/5063* (2013.01); *H03F 1/3252* (2013.01); *G11C 27/02* (2013.01)

USPC .......................................... 327/551; 327/552

(58) Field of Classification Search
USPC .................................. 327/551–559
See application file for complete search history.

(56) References Cited

U.S. PATENT DOCUMENTS

| | | | | |
|---|---|---|---|---|
| 6,084,440 | A * | 7/2000 | Sousa | 327/94 |
| 6,522,187 | B1 | 2/2003 | Sousa | |
| 6,897,721 | B2 * | 5/2005 | Hellberg | 330/149 |
| 2002/0175733 | A1 | 11/2002 | Kondo | |
| 2007/0044024 | A1 | 2/2007 | Na et al. | |
| 2008/0173796 | A1 | 7/2008 | Lum et al. | |

OTHER PUBLICATIONS

EP Office Action issued in EP Application No. 13164357.9, dated Jul. 9, 2014, 5 pages.
Leelavattananon et al., "Balanced Compensation For Highly Linear MOSFET Gate Capacitor Branch", Electronic Letters, vol. 35, No. 17, Aug. 19, 1999, 2 pages.

\* cited by examiner

*Primary Examiner* — Dinh Le
(74) *Attorney, Agent, or Firm* — Kenyon & Kenyon, LLP

(57) ABSTRACT

Embodiments of the present invention may provide an improved apparatus and method for reducing distortion in analog circuits. A circuit in accordance with the present invention may include a main path comprising an analog circuit with an input impedance, a source impedance representing the impedance of an input network driving the analog circuit, and a cancellation path. The cancellation path may be in parallel to the main path and may generate a cancelling non-linear current to substantially cancel a non-linear current drawn to the input impedance, resulting in a decrease of non-liner current flowing through the source impedance.

23 Claims, 8 Drawing Sheets

DISTORTION CANCELLATION IN ANALOG CIRCUITS

RELATED APPLICATIONS

This application claims priority to U.S. Patent Application Ser. No. 61/636,053 filed on Apr. 20, 2012, the content of which is incorporated herein in its entirety.

BACKGROUND

The present invention relates to reducing distortion in analog circuits.

In any analog network, such as a sampling or tracking network, a large portion of the distortion (nonlinearity) is generated by the flow of non-linear current (or charge) in the source resistance/impedance that is connected as input to the sampling network. Sometimes, that impedance is located outside the die and can vary by the user or application. Therefore, devices on the sampling network have little or no control over the distortion generated.

A traditional approach to reducing the distortion was to reduce the non-linear current generated by the sampling network itself. This led to techniques such as gate bootstrapping, back-gate bootstrapping, back-gate floating, buffering, etc.

FIG. 1 shows a conventional sampling network circuit 100 implementing a gate-bootstrapping technique to reduce non-linear current generated by the sampling network 100. Sampling network 100 includes a sampling capacitor 101, a switch 106 connected to capacitor 101, a transistor 102 (M1) that connects the capacitor 101 to an input Vin, a bootstrap circuit 103 connected between Vin and a gate of transistor 102, and additional transistors 104, 105 connected to a back-gate (BG) of transistor 102.

The circuit 100 has two switches 106, 102 connected in series. Switch 106 (shown symbolically connected to the capacitor 101) is clocked by φ1a and switch 102 (M1) is clocked by φ1_btst. φ1a controls when the sample is taken. The signals φ1a and φ1_btst are offset, such that φ1a opens (goes low) before φ1_btst. By providing the bootstrap circuit between Vin and the gate of transistor 102, the voltage between the gate and the source (Vgs) of transistor 102 is fixed (meaning that the transistor's 102 resistance is also fixed). Thus, when Vin varies, the gate voltages changes by the same amount.

Linearity is also provided by connecting BG to Vin so that the voltage between the source and BG is also fixed. In this case, φ2 is opposite in phase to φ1a. During sampling φ1a is on (e.g., high), so that all switches connected to φ1a are turned on and BG is connected to Vin as a result. In the opposite phase, φ2 is on and φ1a is off, so that BG is connected to ground (this refreshes BG). The gate of transistor 102 may also be connected to a switch (not shown) controlled by φ2 to connect the gate to ground.

FIG. 2 is a an equivalent circuit 200 of the sampling network 100 of FIG. 1 during a tracking phase of operation. The sampling network 200 includes a source impedance 202 (Zs) and an input impedance 204 (Zin). Input impedance 204 is the input impedance of a sampling circuit (not shown, but similar to the sampling circuit in FIG. 1) and source impedance 202 is the source impedance of an input network (not shown) that generates Vin to drive the sampling circuit. The propagation of the input signal through the sampling circuit (which is now represented simply by Zin) to a sampling capacitance is one significant source of distortion. In addition, the non-linear component of Zin is another major cause of distortion The voltage sampled by sampling circuit can be represented as follows:

$$Vin = \frac{Vs \cdot Zin}{Zs + Zin} \quad \text{Eq. (1)}$$

If the non-linear component of Zin is ΔZin, the non-linear component of the sampled voltage may be derived as follows:

$$Vin = \frac{Vs(Zin + \Delta Zin)}{Zs + Zin + \Delta Zin} \quad \text{Eq. (2)}$$

$$Vin = \frac{Vs}{1 + \frac{Zs}{Zin}} \left(1 + \frac{Zs \cdot \frac{\Delta Zin}{Zin}}{Zs + Zin}\right) \quad \text{Eq. (3)}$$

$$\frac{\Delta Vin}{Vin} = \frac{\frac{\Delta Zin}{Zin}}{1 + \frac{Zin}{Zs}} \quad \text{or} \quad \frac{\Delta Iin}{Iin} \cdot \frac{Zs}{Zin} \quad \text{Eq. (4)}$$

where ΔVin is the non-linear component of the sampled voltage (i.e. distortion). This formula is general and applies to any input network (whether buffered or unbuffered).

Thus, to have a low distortion, the source impedance Zs should be low, the input impedance of the sampling circuit should be large, and the non-linearity of the input impedance ΔZin should be small and/or the non-linear current ΔIin should be small. Consequently, the performance of pipelined analog-to-digital converters (ADCs) becomes worse as their source impedance increase. Traditionally, this non-linearity could only be reduced by minimizing the input switch non-linear parasitic.

The conventional techniques described above may not adequately reduce distortion in analog systems. Thus, the inventors perceived a need in the art to further reduce distortion in analog systems.

DETAILED DESCRIPTION

Embodiments of the present invention may provide an improved apparatus and method for reducing distortion in analog circuits. A circuit in accordance with the present invention may include a main path comprising an analog circuit with an input impedance, a source impedance representing the impedance of an input network driving the analog circuit, and a cancellation path. The cancellation path may be in parallel to the main path and may generate a cancelling non-linear current to substantially cancel a non-linear current drawn to the input impedance, resulting in a decrease of non-liner current flowing through the source impedance.

Figure 3:
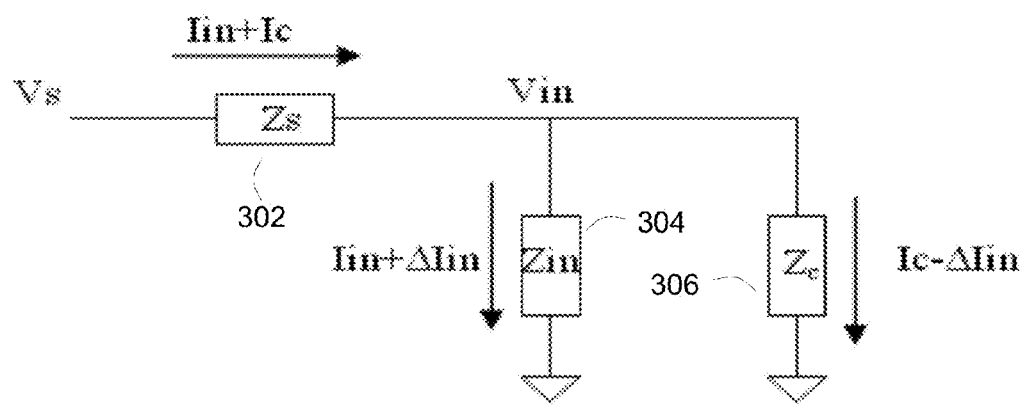
FIG. 3 is a equivalent circuit diagram of an analog network with a cancellation path according to an embodiment of the present invention.

FIG. 3 is an equivalent circuit of analog network 300 in accordance with an embodiment of the present invention. Analog network 300 may include a source impedance 302 (Zs) representing an impedance of an input network (not shown), a main path with an input impedance 304 (Zin), and a cancellation path with a cancellation impedance 306 (Zc). The main path and cancellation path may be parallel to each other.

Input impedance 304 of the main path may represent an impedance of an analog circuit (not shown) of the analog network 300. The analog circuit may be driven by a power source (not shown). Examples of exemplary analog circuits include sampling circuits, tracking circuits, analog-to-digital converters, and the like. The input impedance 304 may comprise a combination of various circuit elements in the analog circuit including transistors, capacitors, resistors, inductors, etc.

Source impedance 302 may represent an impedance of an input network (not shown) that provides current to drive the analog network 300. The input network may be a power source that provides continuous voltage or current to the analog circuit of the network.

Cancellation impedance 306 of the cancellation path may represent an impedance of a cancellation circuit (not shown, but represented by impedance Zc). The cancellation circuit may comprise a combination of various circuit elements including transistors, amplifiers, capacitors, etc. The cancellation circuit may be an opposing network that generates a non-linear current that that is equal and opposite to the non-linear current drawn by input impedance 304 of the analog circuit (represented as Zin) in the main path. Moreover, the cancellation circuit may be redundant (i.e., no functionality besides cancelling non-linear current in the main path) or may be a part of a functional circuit (e.g. an amplifier or a comparator).

Assuming the nonlinearity in input impedance 304 is a current $\Delta$Iin, then the cancellation impedance 306 may generate an equal and opposite non-linear current $-\Delta$Iin to cancel $\Delta$Iin. Consequently, a net non-linear current flowing through source impedance 302 may be substantially equal to zero. In this manner, the non-linear current does not flow in the source impedance 302 and therefore does not cause distortion in the sampled voltage of the analog circuit (this will be described in more detail below).

Figure 4:
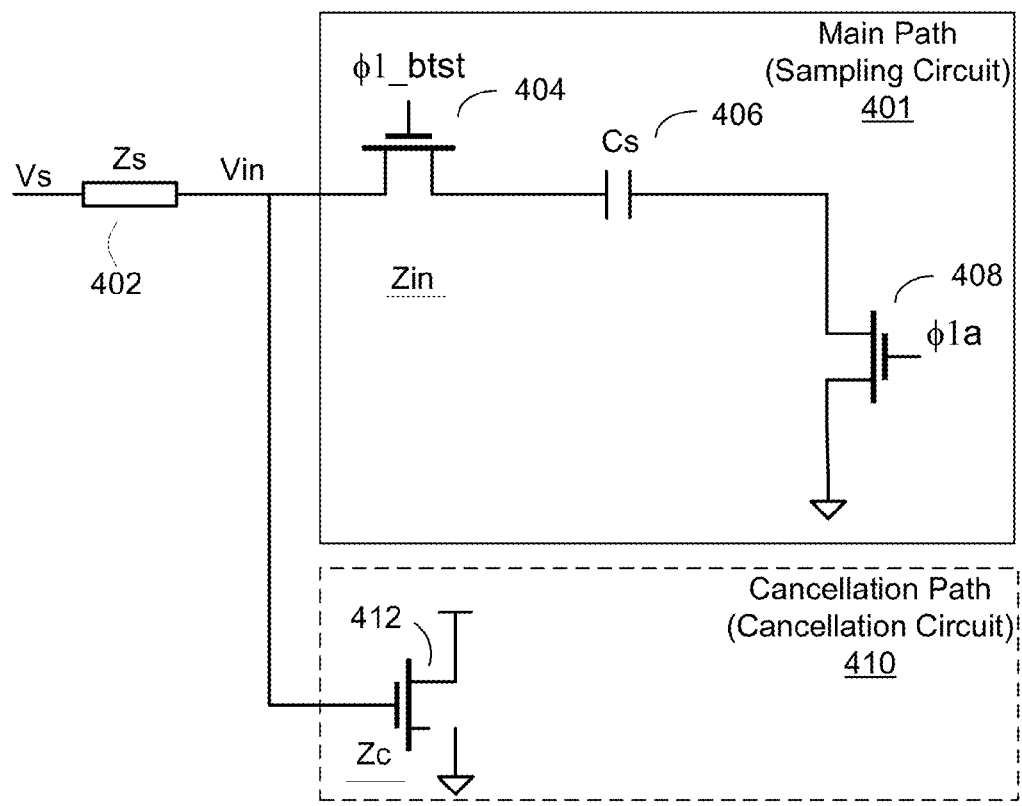
FIG. 4 is a block diagram of an analog network with a cancellation path according to an embodiment of the present invention.

FIG. 4 is a circuit embodiment of a sampling network 400 in accordance with the present invention. Similar to the network 300 of FIG. 3, a sampling network 400 of FIG. 4 may include a main path 401 in parallel to a cancellation path 410. Sampling network 400 may also include a source (not shown), with a source impedance 402 (Zs), that drives the network 400 with a voltage Vin.

Figure 1:
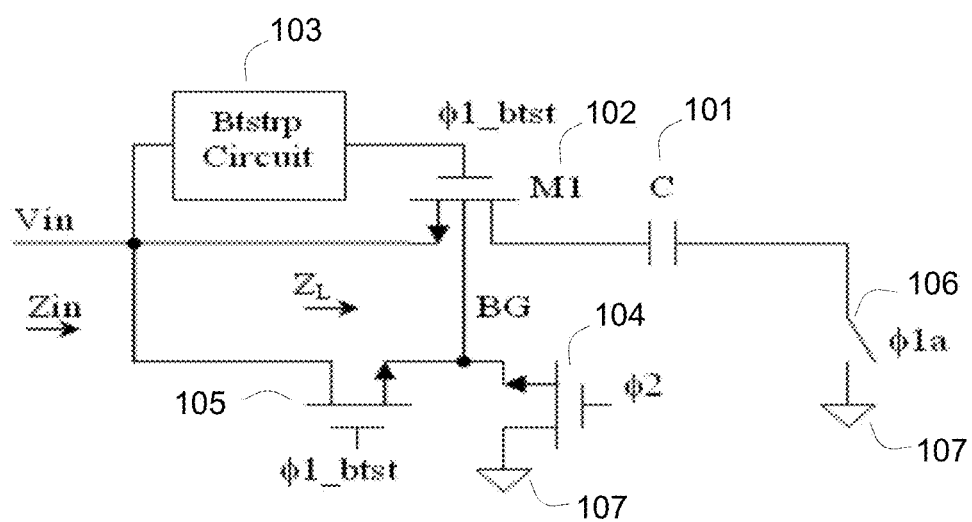
FIG. 1 is a block diagram of a conventional sampling network with a bootstrap network.
Figure 2:
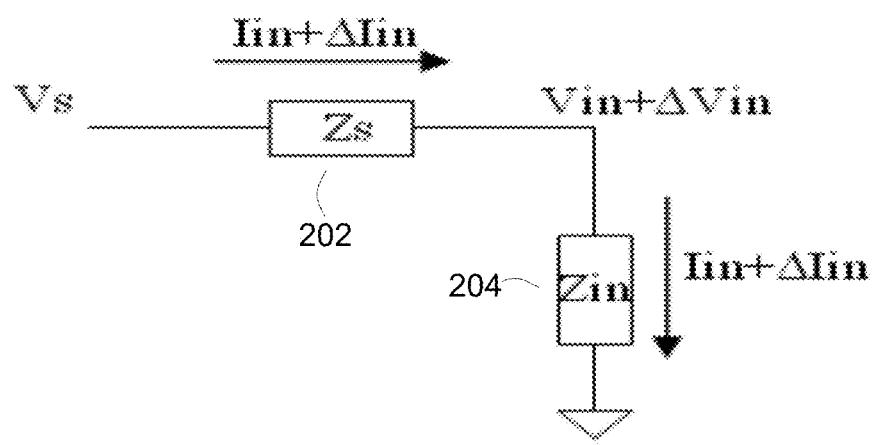
FIG. 2 is an equivalent circuit diagram of the conventional sampling network of FIG. 1.

Main path 401 may include a sampling circuit (also shown as 401) comprising transistors 404, 408 coupled to opposites ends of a sampling capacitor 406 (Cs). The transistors 404, 408 may be NMOS transistors. NMOS transistor 404 may be controlled by a signal ϕ1_btst and NMOS transistor 408 may be controlled by a signal ϕ1a. Sampling capacitor 406 and transistors 404, 408 form a sampling circuit 401 and may perform functions similar to the analogous components in FIG. 1(a). The sampling circuit 401 may have an input impedance Zin which represents the impedance of the components in the circuit 401.

Cancellation path 410 may include a cancellation circuit (also shown as 410) comprising transistor 412. Transistor 412 may be an NMOS transistor with a source connected to a positive supply voltage (e.g. Vdd) and a drain connected to a negative supply voltage (e.g. Vss). Cancellation circuit 410 may have a cancellation impedance Zc which represents the impedance of the components in the circuit 410.

NMOS cancellation transistor 412 may be biased in saturation mode and used as a load. The gate-to-drain capacitance (Cgd) of the transistor 412 may be non-linear in a fashion that is out of phase with the non-linearity of the input impedance Zin of the sampling circuit 401. This is due to the opposite polarity of the drain to gate capacitance compared to transistors 404, 408 in the sampling circuit (or main path) 401.

Thus, as described above with reference to FIG. 3, if the non-linearity of sampling circuit 401 (represented as Zin) is a current $\Delta$Iin, then the cancellation circuit 410 (represented as Zc) may be designed to generate an equal and opposite current $-\Delta$Iin to substantially cancel $\Delta$Iin (designing/choosing the ideal cancellation circuit 410 will be described in further detail below with respect to FIG. 7). The cancellation of $\Delta$Iin results in a net non-linear current flowing through source impedance 402 (Zs) that may be substantially equal to zero. In this manner, non-linear current may not flow through source impedance 402 (Zs) and hence may not cause distortion in the voltage sampled by sampling circuit 401.

In other embodiments of the present invention, cancellation circuit 410 may comprise multiple NMOS transistor in parallel (rather than the single NMOS transistor 412 shown in FIG. 4). Moreover, the transistors 404, 408, 412 may alternatively be PMOS devices (as long as the transistors in the main branch 401 and cancellation branch 410 are of the same type).

Figure 5:
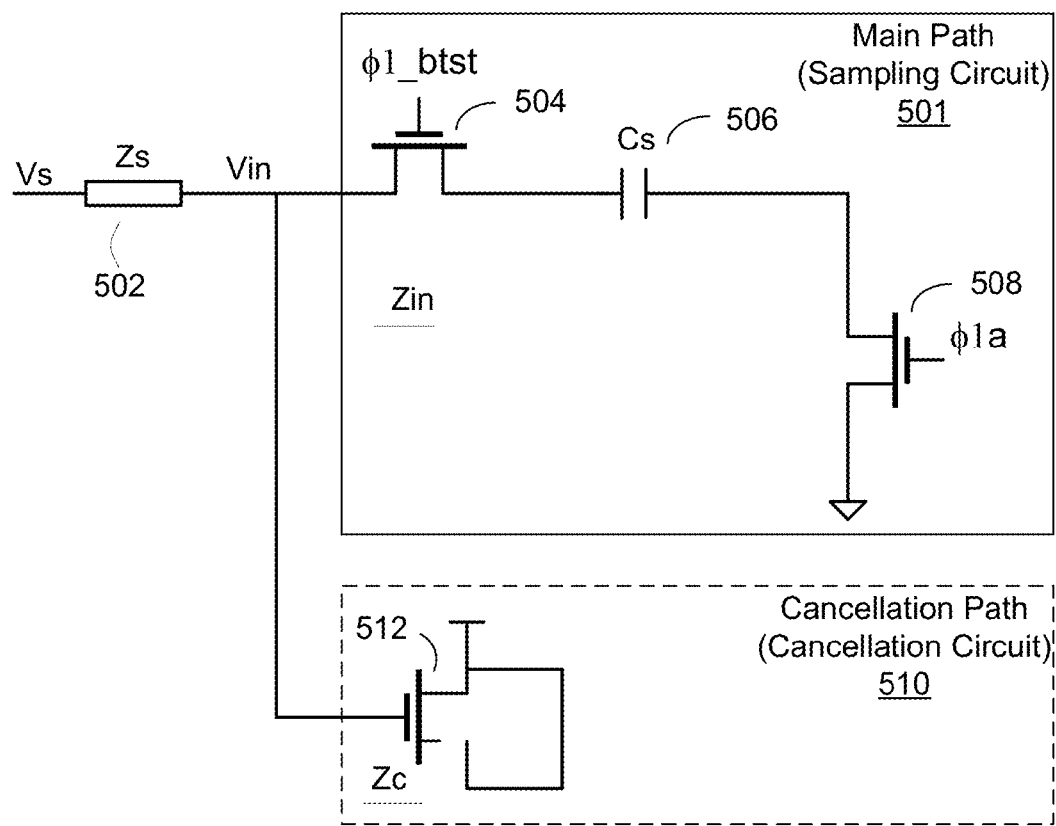
FIG. 5 is a block diagram of an analog network with a cancellation path according to an embodiment of the present invention.

FIG. 5 is another circuit embodiment of a sampling network 500 in accordance with the present invention. Similar to the network 300 of FIG. 3, a sampling network 500 of FIG. 5 may include a main path 501 in parallel to a cancellation path 510. Sampling network 500 may also include a source (not shown), with a source impedance 502 (Zs), that drives the network 500 with a voltage Vin.

Main path 501 may include a sampling circuit (also shown as 501) comprising transistors 504, 508 coupled to opposites ends of a sampling capacitor 506 (Cs). The transistors 504, 508 may be NMOS transistors. NMOS transistor 504 may be controlled by a signal ϕ1_btst and NMOS transistor 508 may be controlled by a signal ϕ1a. Sampling capacitor 506 and transistors 504, 508 form a sampling circuit 501 and may perform functions similar to the analogous components in FIG. 1(a). The sampling circuit 501 may have an input impedance Zin which represents the impedance of the components in the circuit 501.

Cancellation path 510 may include a cancellation circuit (also shown as 510) comprising transistor 512. Transistor 512 may be an NMOS transistor with a source and drain tired together in a capacitor-like configuration. Cancellation circuit 510 may have a cancellation impedance Zc which represents the impedance of the components in the circuit 510.

NMOS cancellation transistor 512 may operate in depletion mode. The gate-to-drain capacitance (Cgd) of the transistor 512 may be non-linear in a fashion that is out of phase with the non-linearity of the input impedance Zin of the sampling circuit 501. This is due to the opposite polarity of the drain to gate capacitance compared to transistors 504, 508 in the sampling circuit (or main path) 501.

Thus, as described above with reference to FIG. 3, if the non-linearity of sampling circuit 510 (represented as Zin) is a current $\Delta$Iin, then the cancellation circuit 510 (represented as Zc) may be designed to generate and equal and opposite current $-\Delta$Iin to substantially cancel $\Delta$Iin (designing/choosing the ideal cancellation circuit 510 will be described in further detail below with respect to FIG. 7). The cancellation of $\Delta$Iin results in a net non-linear current flowing through source impedance 502 (Zs) that may be substantially equal to zero. In this manner, non-linear current may not flow through source impedance 502 (Zs) and hence may not cause distortion in the voltage sampled by sampling circuit 501.

In an embodiment of the present invention, cancellation circuit 510 may comprise multiple NMOS transistor in parallel (rather than the single NMOS transistor shown in FIG. 5). Moreover, the transistors 504, 508, 512 may alternatively be PMOS devices (as long as the transistors in the main branch 501 and cancellation branch 510 are of the same type).

The embodiments of the present invention described in FIGS. 4 and 5 may include cancellation circuits that are redundant (i.e. no functionality besides cancelling non-linear current in the main paths). Alternative embodiments of the present invention may utilize functional parts of circuits to achieve non-linear current cancellation (e.g. and amplifier).

Figure 6:
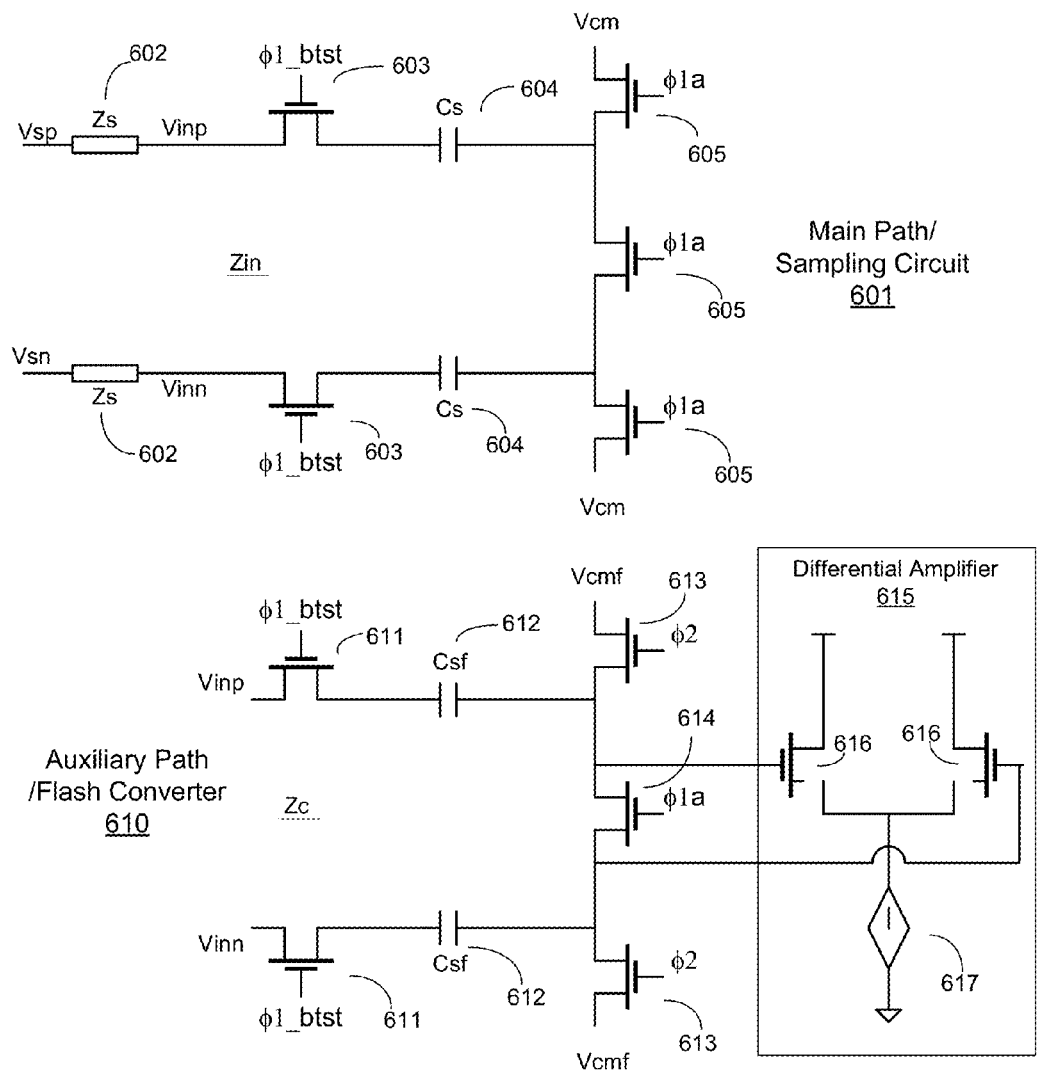
FIG. 6 is a block diagram of an analog network with a cancellation path according to an embodiment of the present invention.

FIG. 6 is another circuit embodiment of a sampling network 600 in accordance with the present invention. Sampling network 600 utilizes a functional network (a differential amplifier), rather than the dummy networks in FIGS. 4 and 5, to reduce distortion in a sampling network.

Sampling network 600 of FIG. 6 may include a differential main path (sampling circuit) 601 and a differential auxiliary flash path (which includes a cancellation circuit) 610. The main path 601 and auxiliary path 610 may be parallel to each other (similar to the main and cancellation paths in the previous embodiments) and have common differential input voltages Vinp, Vinn generated by a source (not shown, but represented by impedance 602 or Zs).

Main path 601 may include a differential sampling circuit (also labeled as 601) to sample and store differential input voltages Vinp, Vinn. Sampling circuit 601 may comprise transistors 603, 605 and sampling capacitors 604 (Cs). Sampling capacitors 604 may be coupled to corresponding transistors 603 on one end and corresponding transistors 605 on the other end.

Transistors 603, 605 may be NMOS transistors. Transistors 603 may be controlled by a signal $\phi1\_btst$ and transistors 605 may be controlled by a signal $\phi1a$. Sampling capacitors 604 and transistors 603, 605 form a differential sampling circuit 601 and may perform functions similar to the analogous components in FIG. 1(a). The sampling circuit 601 may have an input impedance Zin which represents the impedance of the components in the circuit 601.

Auxiliary flash path 610 may include a flash converter (also labeled 610) to perform analog-to-digital (ADC) conversion of the common differential input voltages Vinp, Vinn. Flash converter 610 may include flash sampling capacitors 612 (Csf), transistors 611, 613, and 614, and a differential amplifier 615. Sampling capacitors 612 may be coupled to corresponding transistors 611 on one end and transistors 613, 614 on the other end. Differential amplifier 615 may be coupled to a gate and source of transistor 614.

Transistors 611, 613, and 614 may be NMOS transistors. Transistors 611 may be controlled by a signal $\phi1\_btst$, transistors 613 may be controlled by a signal $\phi2$, and transistor 614 may be controlled by a signal $\phi1a$.

Differential amplifier 615 may include a pair of transistors 616 and a current source 617. A drain of each transistor 616 may be coupled to VSS and the sources of transistors 614 may be coupled to each other and the current source 617. Current source 617 may also be coupled to VDD. A gate of each transistor 614 may be coupled to Vinp and Vinn respectively (when switch 611 is on).

Transistors 614 may possess the same characteristics as each other and may be NMOS transistors. Transistors 614 may be selected to have a combined impedance capable of generating a non-linear current to substantially cancel a non-linear current flowing through source impedance 602 (Zs) caused by the main path sampling circuit 601 (described in further detail below).

Each NMOS transistor 616 may be biased in saturation mode and used as a load. The gate-to-drain capacitance (Cgd) of each transistor 616 may be non-linear in a fashion that is out of phase with the non-linearity of the input impedance Zin of the sampling circuit 601. This is due to the opposite polarity of the gate-to-drain capacitance compared to the transistors 603, 605 in the sampling circuit (or main path) 601.

Thus, as described above with reference to FIG. 3, if the non-linearity of sampling circuit 601 (represented as Zin) is a current $\Delta$Iin, then the transistor pair 616 (represented as Zc) may be designed to generate and equal and opposite current $-\Delta$Iin to substantially cancel $\Delta$Iin (designing/choosing the ideal auxiliary path 610 cancellation components will be described in further detail below with respect to FIG. 7). The cancellation of $\Delta$Iin results in a net non-linear current flowing through source impedance 602 (Zs) that may be substantially equal to zero. In this manner, non-linear current may not flow through source impedance 602 (Zs) and hence may not cause distortion in the voltage sampled by sampling circuit 601.

Figure 7:
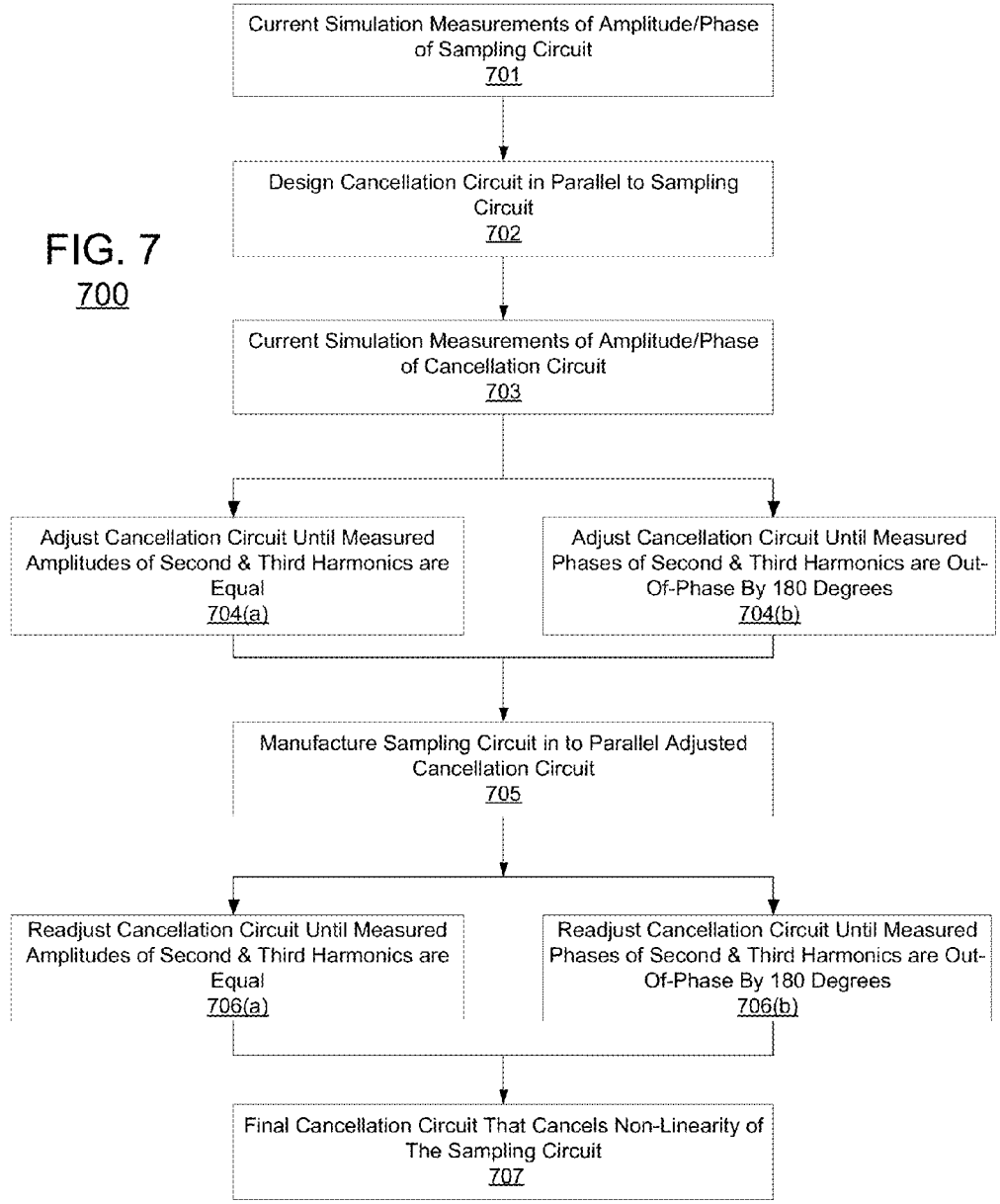
FIG. 7 is a flow chart of a method of designing a cancellation circuit according to an embodiment of the present invention.

FIG. 7 is a flowchart of a method 700 for designing and implementing a cancellation circuit to substantially cancel non-linearity in an analog circuit (e.g. a sampling circuit or and ADC). The cancellation circuit may be provided in parallel (as a cancellation path) to the analog circuit (which is in a main path) in a fashion similar to the embodiments described above with respect to FIGS. 3-6. Method 700 may be implemented during a circuit design and manufacturing phase to reduce the non-linearity in the analog circuit until it is as close to zero as possible (within design and manufacturing limitations).

At step 701, current simulation measurements of the amplitude and phase of non-linearity in the sampling circuit may be performed. The second and third harmonics of the current flowing through sampling circuit may be the non-linear (or distortion) components in the current. The cancellation circuit may then be constructed in parallel to the sampling circuit in step 702 and current simulation measurements of the amplitude and phase of the non-linearity in the cancellation circuit may be performed in step 703.

In step 704(a), the design of the cancellation circuit may be adjusted until the measured amplitude of the second and third harmonics (non-linear components) of current flowing through the cancellation circuit are equal to the amplitudes of the second and third harmonics of current flowing through the analog circuits. In step 704(b), the design of the cancellation circuit may be further adjusted until the measured phases of the second and third harmonics of the current flowing through the cancellation circuit are opposite (e.g., ideally, but not necessarily 180 degrees out-of-phase) to the phases of the second and third harmonics of current flowing through the analog circuit. Adjusting the cancellation circuit may include adjusting device characteristics of the transistors in the cancellation branch, adjusting supply voltages to the transistors in the cancellation branch, and/or adjusting bias currents of the transistors in the cancellation branch.

Next, in step 705, a device that includes the design of the sampling circuit in parallel to the adjusted design of the cancellation branch may be manufactured. Once manufacturing is complete, actual measurements of the amplitude and phase of the non-linear current components flowing through the manufactured analog and cancellation circuits may be taken.

The cancellation circuit may be readjusted until the actual measured amplitude of the non-linear current components of the cancellation circuit is equal to the amplitude of the non-linear current components of the analog circuit (step 706($a$)). Moreover, the cancellation circuit may be further readjusted until the measured phases of the non-linear current components flowing through the cancellation circuit are opposite (e.g., ideally, but not necessarily 180 degrees out-of-phase) to the phases of the non-linear current components flowing through the analog circuit. The resulting cancellation circuit design may substantially cancel the non-linearity/noise in an analog circuit and improve its accuracy.

Figure 8:
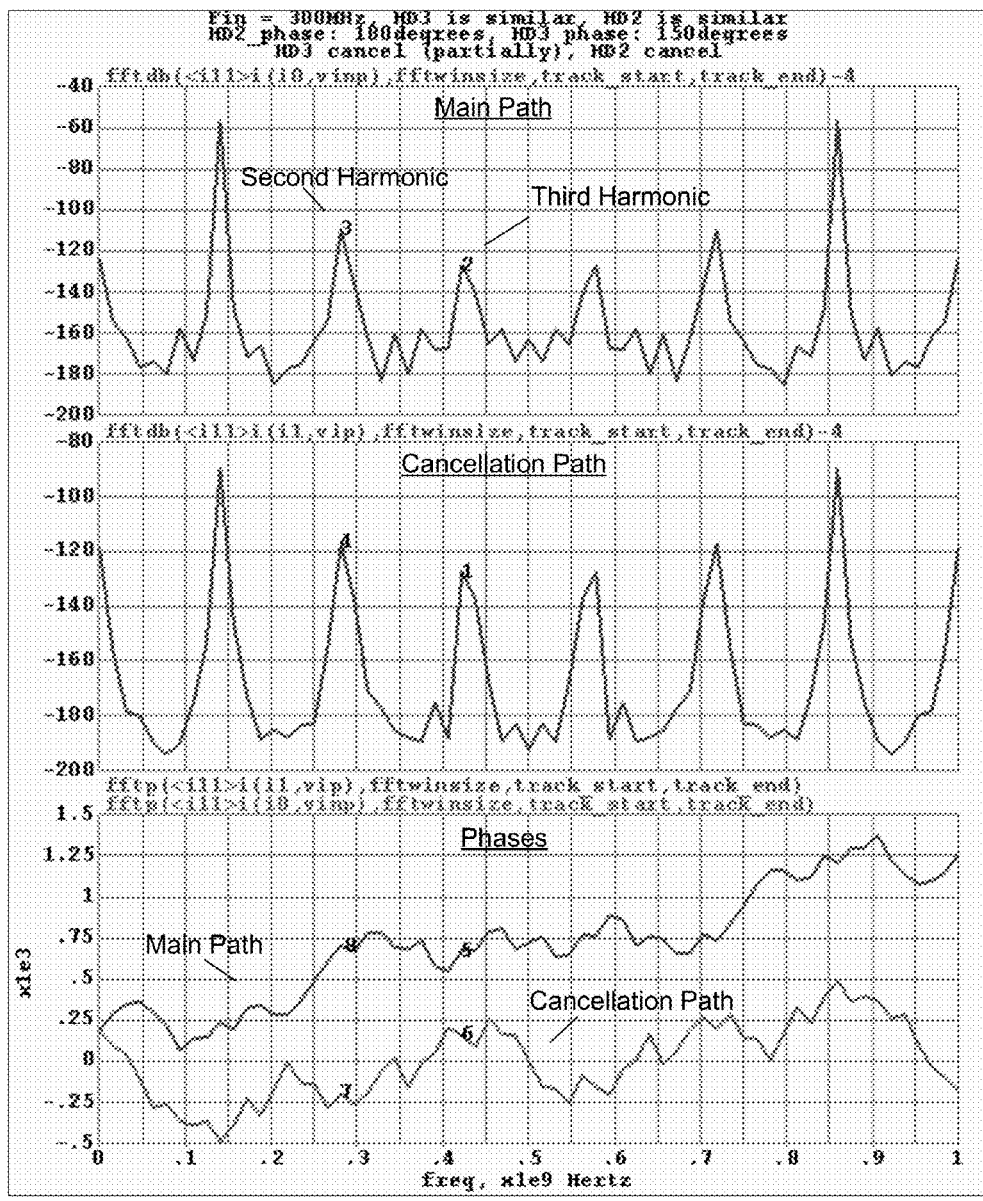
FIG. 8 is a graph of a Fast Fourier Transform (FFT) of current flowing through a main path and cancellation path of an analog network according to an embodiment of the present invention.

FIG. 8 is a Fast-Fourier-Transform (FFT) graph of the amplitude and current flowing through an analog circuit (main path) and a cancellation circuit (cancellation path) designed according to method 700 described above with respect FIG. 7. As described above, at the second and third harmonics, the amplitudes of the current in the main path and cancellation path are similar. At the second harmonic, the phases of the current in the main and cancellation path are 180 degrees out of phase. At the third harmonic, the phases of the current in the main and cancellation path are 150 degrees out of phase. Thus, the non-linear current components (e.g., the second and third harmonics) in the main path may be substantially cancelled because the non-linear current components in the cancellation path are equal in amplitude and approximately 180 degrees out of phase.

Although the foregoing techniques have been described above with reference to specific embodiments, the invention is not limited to the above embodiments and the specific configurations shown in the drawings. For example, some components shown may be combined with each other as one embodiment, or a component may be divided into several subcomponents, or any other known or available component may be added. Those skilled in the art will appreciate that these techniques may be implemented in other ways without departing from the sprit and substantive features of the invention. The present embodiments are therefore to be considered in all respects as illustrative and not restrictive.

We claim:

1. An integrated circuit comprising:
   a main path, comprising a first analog circuit having an input impedance, the main path having a first output, wherein the input impedance generates a first non-linear current;
   a cancellation path, sharing a common input with the main path, comprising a second analog circuit having a cancellation impedance, the cancellation path having a second output different from the first output, wherein the cancellation impedance generates a second non-linear current;
   an input network providing a common input voltage to drive the main path and the cancellation path of the integrated circuit; and
   a source impedance representing an impedance of the input network driving the main path and the cancellation path of the integrated circuit;
   wherein the cancellation path is parallel to and separate from the main path, wherein the second non-linear current, drawn to the cancellation impedance, substantially cancels the first non-linear current drawn to the input impedance, resulting in a decrease of a non-linear source current flowing through the source impedance.

2. The integrated circuit of claim 1, wherein the second non-linear current generated by the cancellation path and the first non-linear current drawn to the input impedance are equal in amplitude and opposite in phase.

3. The integrated circuit of claim 1, wherein the second analog circuit of the cancellation path comprises a circuit network redundant to the first analog circuit of the main path whose only function is to decrease the non-linear source current flowing through the source impedance.

4. The integrated circuit of claim 1, wherein the second analog circuit of the cancellation path includes a network having functions other than decreasing the non-linear source current flowing through the source impedance.

5. The integrated circuit of claim 1, wherein the cancellation path contains a plurality of NMOS transistors.

6. The integrated circuit of claim 1, wherein the cancellation path contains a plurality of PMOS transistors.

7. An integrated circuit comprising:
   a main path, comprising a first analog circuit having an input impedance, wherein the input impedance generates a first non-linear current;
   a cancellation path, comprising a second analog circuit having a cancellation impedance, wherein the cancellation impedance generates a second non-linear current;
   an input network providing a common input voltage to drive the main path and the cancellation path;
   a source impedance representing an impedance of the input network driving the main path and the cancellation path of the integrated circuit;
   wherein the cancellation path is parallel to the main path, wherein the second non-linear current, drawn to the cancellation impedance, substantially cancels the first non-linear current drawn to the input impedance, resulting in a decrease of a non-linear source current flowing through the source impedance;
   the main path comprises a sampling circuit with NMOS transistors coupled to respective ends of a sampling capacitor; and
   the cancellation path comprises a transistor and the input network is coupled to a gate of the transistor.

8. A method comprising:
   providing a cancellation circuit path in parallel to a main circuit path;
   measuring, by a measuring device, current flowing through the main circuit path to determine non-linear current components in the main circuit path;
   measuring, by the measuring device, current flowing through the cancellation circuit path to determine non-linear current components in the cancellation circuit path;
   adjusting, with a processor, a design of the cancellation circuit path until the measured non-linear components of the cancellation circuit path are substantially equal in amplitude and opposite in phase to the non-linear current components in the main circuit path.

9. The method of claim 8, wherein the non-liner current components are second and third harmonics of the current flowing through the main circuit and cancellation circuit paths.

10. The method of claim 8, wherein the adjusting comprises adjusting transistor supply voltages in the cancellation circuit path.

11. The method of claim 8, wherein the adjusting comprises adjusting transistor bias currents in the cancellation circuit path.

12. The method of claim 8, wherein the cancellation path comprises a second circuit network redundant to a first circuit network in the main circuit path whose only function is to cancel the non-linear current components in the main circuit path.

13. The method of claim 8, wherein a circuit network of the cancellation circuit path comprises a network having functions other than cancelling the non-linear current components in the main circuit path.

14. A method comprising:
   providing a cancellation circuit path in parallel to a main circuit path;
   measuring, by a measuring device, current flowing through the main circuit path to determine non-linear current components in the main circuit path;
   measuring, by the measuring device, current flowing through the cancellation circuit path to determine non-linear current components in the cancellation circuit path;
   adjusting, with a processor, a design of the cancellation circuit path until the measured non-linear components of the cancellation circuit path are substantially equal in amplitude and opposite in phase to the non-linear current components in the main circuit path;
   an input network provides a common input voltage to drive the main path and the cancellation path;
   the main path comprises a sampling circuit with transistors coupled to respective ends of a sampling capacitor; and
   the cancellation path comprises a transistor and the input network is coupled to a gate of the transistor.

15. The method of claim 8, wherein the cancellation circuit path comprises a plurality of NMOS transistors in parallel.

16. The method of claim 8, wherein the cancellation circuit path comprises a plurality of PMOS transistors in parallel.

17. A circuit comprising:
   a sampling circuit, the sampling circuit having a first output, wherein the sampling circuit generates a first plurality of non-linear current components; and
   a cancellation circuit, in parallel to and separate from the sampling circuit, sharing a common input with the sampling circuit, the cancellation circuit having a second output different from the first output, wherein the cancellation circuit generates a second plurality of non-linear current components,
   wherein the second plurality of non-linear current components are substantially equal in amplitude and opposite in phase to the first plurality of non-linear current components generated by the sampling circuit, resulting in a substantial cancelling of the first plurality of non-linear current components generated by the sampling circuit.

18. The circuit of claim 17, wherein the non-linear current components are second and third harmonics of current flowing the sampling and cancellation circuits.

19. The circuit of claim 17, wherein the cancellation circuit comprises a single-transistor network redundant to the sampling circuit whose only function is to cancel the first plurality of non-linear current components in the sampling circuit.

20. The circuit of claim 17, wherein the cancellation circuit comprises a network having functions other than cancelling the non-linear current components in the main circuit.

21. The circuit of claim 17, wherein the cancellation circuit comprises a plurality of NMOS transistors in parallel.

22. The circuit of claim 17, wherein the cancellation circuit comprises a plurality of PMOS transistors in parallel.

23. A circuit comprising:
   a sampling circuit, wherein the sampling circuit generates a first plurality of non-linear current components; and
   a cancellation circuit, in parallel to the sampling circuit, sharing a common input with the sampling circuit, the cancellation circuit having a second output different from the first output, wherein the cancellation circuit generates a second plurality of non-linear current components,
   wherein the second plurality of non-linear current components are substantially equal in amplitude and opposite in phase to the first plurality of non-linear current components generated by the sampling circuit, resulting in a substantial cancelling of the first plurality of non-linear current components generated by the sampling circuit;
   an input network provides a common input voltage to drive the main circuit and the cancellation circuit;
   the main circuit comprises a sampling circuit with transistors coupled to respective ends of a sampling capacitor; and
   the cancellation circuit comprises a transistor and the input network is coupled to a gate of the transistor.

* * * * *